United States Patent [19]

Hughes

[11] Patent Number: 4,472,765
[45] Date of Patent: Sep. 18, 1984

[54] CIRCUIT STRUCTURE

[75] Inventor: Peter F. Hughes, Smartville, Calif.

[73] Assignee: Hughes Electronic Devices Corporation, Grass Valley, Calif.

[21] Appl. No.: 420,219

[22] PCT Filed: Jun. 7, 1982

[86] PCT No.: PCT/US82/00776
§ 371 Date: Sep. 13, 1982
§ 102(e) Date: Sep. 13, 1982

[87] PCT Pub. No.: WO83/04466
PCT Pub. Date: Dec. 22, 1983

[51] Int. Cl.³ .............................................. H05K 1/14
[52] U.S. Cl. .................................... 361/413; 361/393;
361/395; 361/412; 361/416
[58] Field of Search ............... 361/393, 395, 412, 413,
361/414, 415; 364/416

[56] References Cited

U.S. PATENT DOCUMENTS

| | | | |
|---|---|---|---|
| 2,701,346 | 2/1955 | Powell | 361/413 X |
| 2,799,837 | 7/1957 | Powell | 339/17 M |
| 2,955,236 | 10/1960 | Luhn | 361/412 |
| 3,206,648 | 9/1965 | Jordan, Jr. et al. | 361/416 |
| 3,355,722 | 11/1967 | Grubb et al. | 361/413 X |
| 3,660,803 | 5/1972 | Cooney | 339/17 LM X |
| 3,668,476 | 6/1972 | Wrabel et al. | 361/413 |
| 4,179,724 | 12/1979 | Bonhomme | 361/415 X |
| 4,220,382 | 9/1980 | Richie et al. | 339/17 LM |

FOREIGN PATENT DOCUMENTS 2214678 9/1973 Fed. Rep. of Germany ...... 361/413

*Primary Examiner*—R. R. Kucia
*Attorney, Agent, or Firm*—Harry R. Lubcke

[57] ABSTRACT

A three-dimensional circuit structure suited for a routing type electronic switcher matrix, for analog or digital signals, in which internal wire interconnections are not required.

Plural parallel-disposed zero-insertion-force connectors are orthogonally related on opposite sides of motherboards that divide tiers in the structure.

Selected conductive pins of the connectors are electrically connected to make necessary interconnections.

Printed circuit cards are inserted in the zero-insertion-force connectors for carrying a large plurality of solid-state, or equivalent, cross points, and are inter-connected by the selected conductive pins.

10 Claims, 8 Drawing Figures

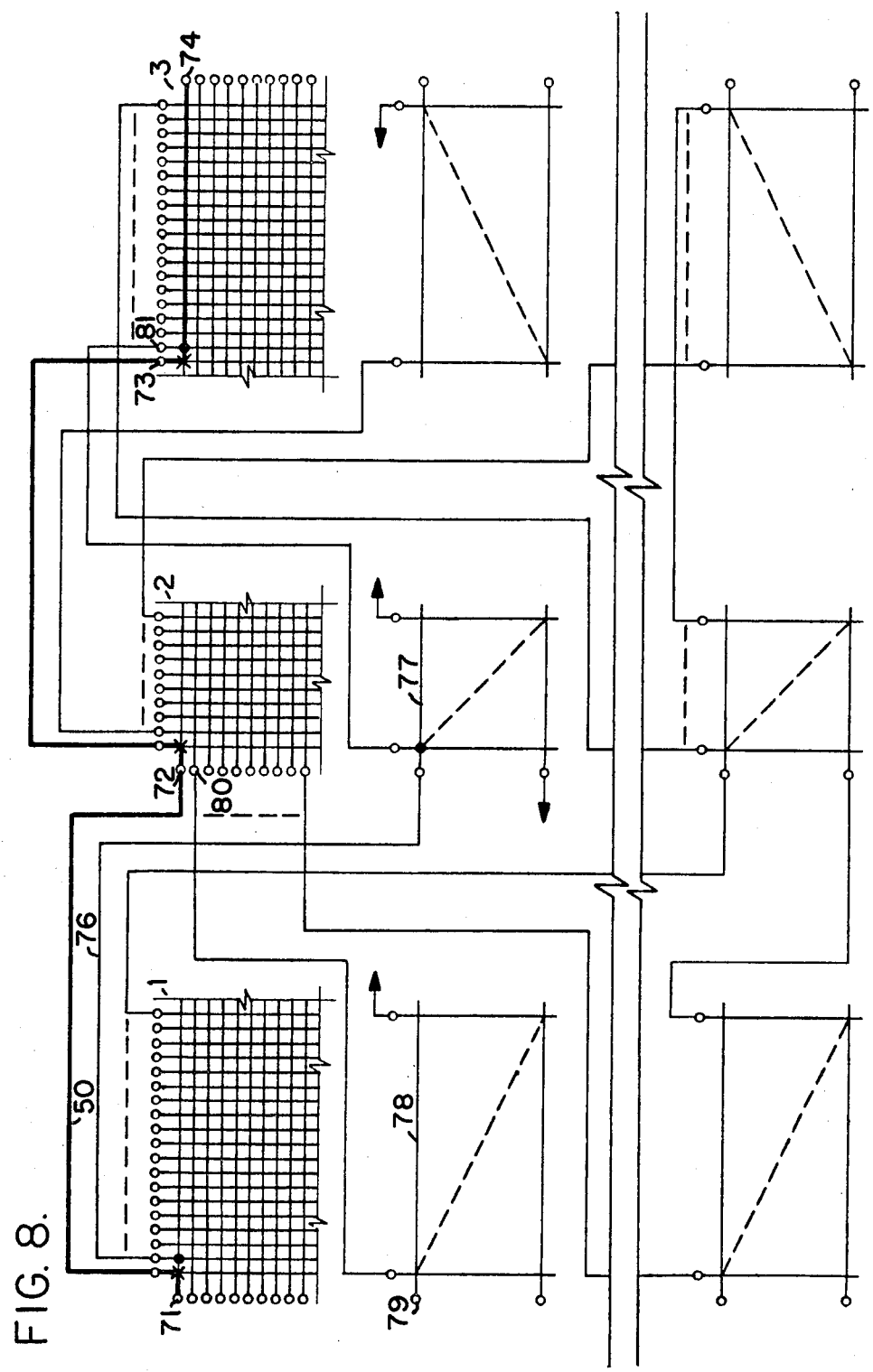

CIRCUIT STRUCTURE

DESCRIPTION

1. Technical Field

This invention pertains to the mechanical arrangement of related multiple electrical circuits.

2. Background Art

U.S. Pat. No. 3,206,648 discloses a quasi-three-dimensional structure in which electronic components are connected between metallic X and Z axis combs and Y axis buses in spaced relation.

However, elongated boxes (47) are provided between each tier through which the many inter-connecting wires must be run.

A large number of insulating spacers (30) are used to support the combs and the buses. "Tridimensional conductors functions are presented in a bidirectional manner." (col 2, lines 40-1).

Mother-boards are not mentioned, nor are zero-insertion-force connectors; these having been invented a few years *after* the filing dated of this invention. Obviously, there is no suggestion of the coordinated connection of zero-insertion-force connector pins from one side of a mother-board to the other.

In U.S. Pat. No. 3,206,648 the signal paths are strictly two-dimensional, with *control circuits only* in the third dimension.

U.S. Pat. No. 3,377,515 discloses a two-tier cage for holding a plurality of circuit cards and making connections thereto. A plurality of finger pairs (30) on the cage make contact to each circuit card. The circuit arrangement is two-dimensional and there is no mention of any scheme for connecting the finger pairs, one to another.

DISCLOSURE OF INVENTION

A three-dimensional mechanical disposition of an electrical circuit having plural inputs and plural outputs. The structure is arranged in tiers. It is comprised of circuit-carrying cards disposed on edge between intervening mother-boards. Zero-insertion-force (ZIF) connectors upon the mother-boards accept the circuit-carrying cards, making selected contacts with the circuits thereof.

Conductive pins of the ZIF connectors make common point electrical connections through the mother-boards. ZIF connectors of alternate tiers are orthogonally arranged.

The structure eliminates wire connections between tiers.

BRIEF DESCRIPTION OF DRAWINGS

FIG. 8 is a schematic diagram of a routing type switcher that can be embodied in the three-dimensional circuit structure of this invention.

BEST MODE FOR CARRYING OUT THE INVENTION

Figure 4:
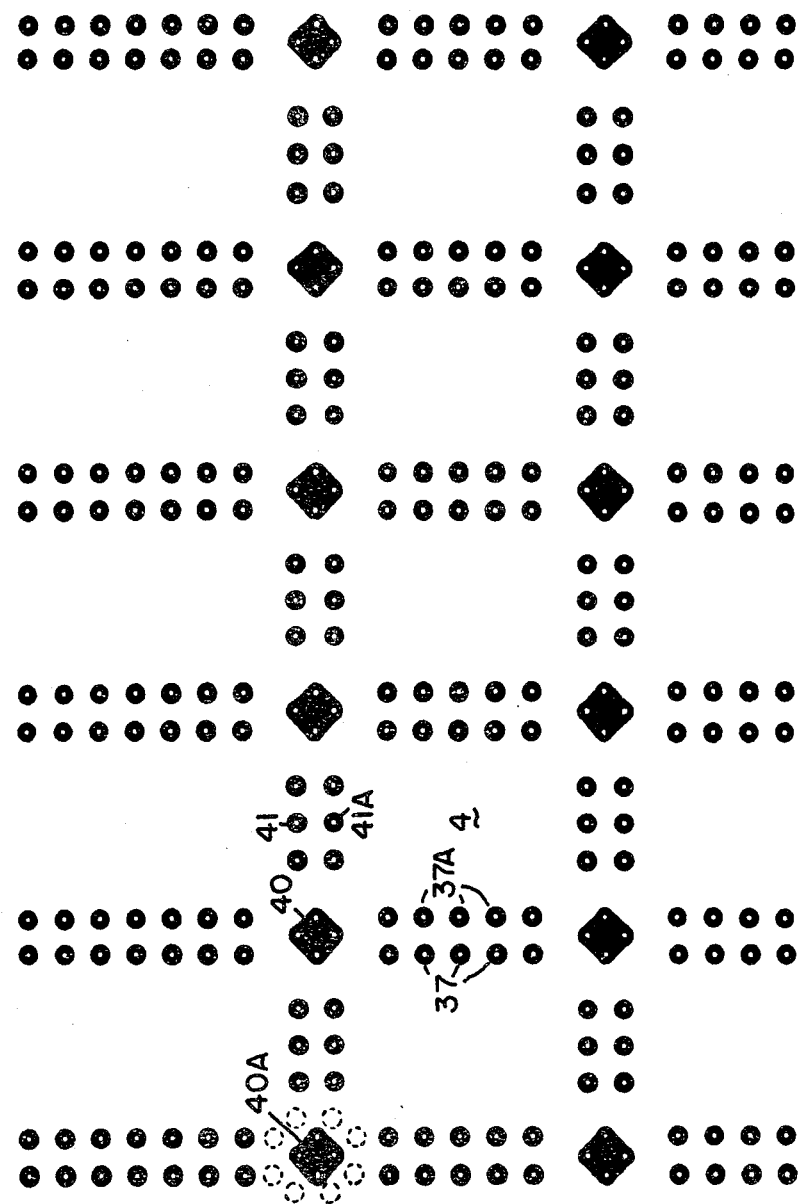
FIG. 4 is a plan view of pin connection intersections.

The essential aspect of the invention is shown in FIG. 4 where the pin connections through a mother-board are shown as black diamond shapes. These are electrically conductive areas that connect plural pins.

Figure 1:
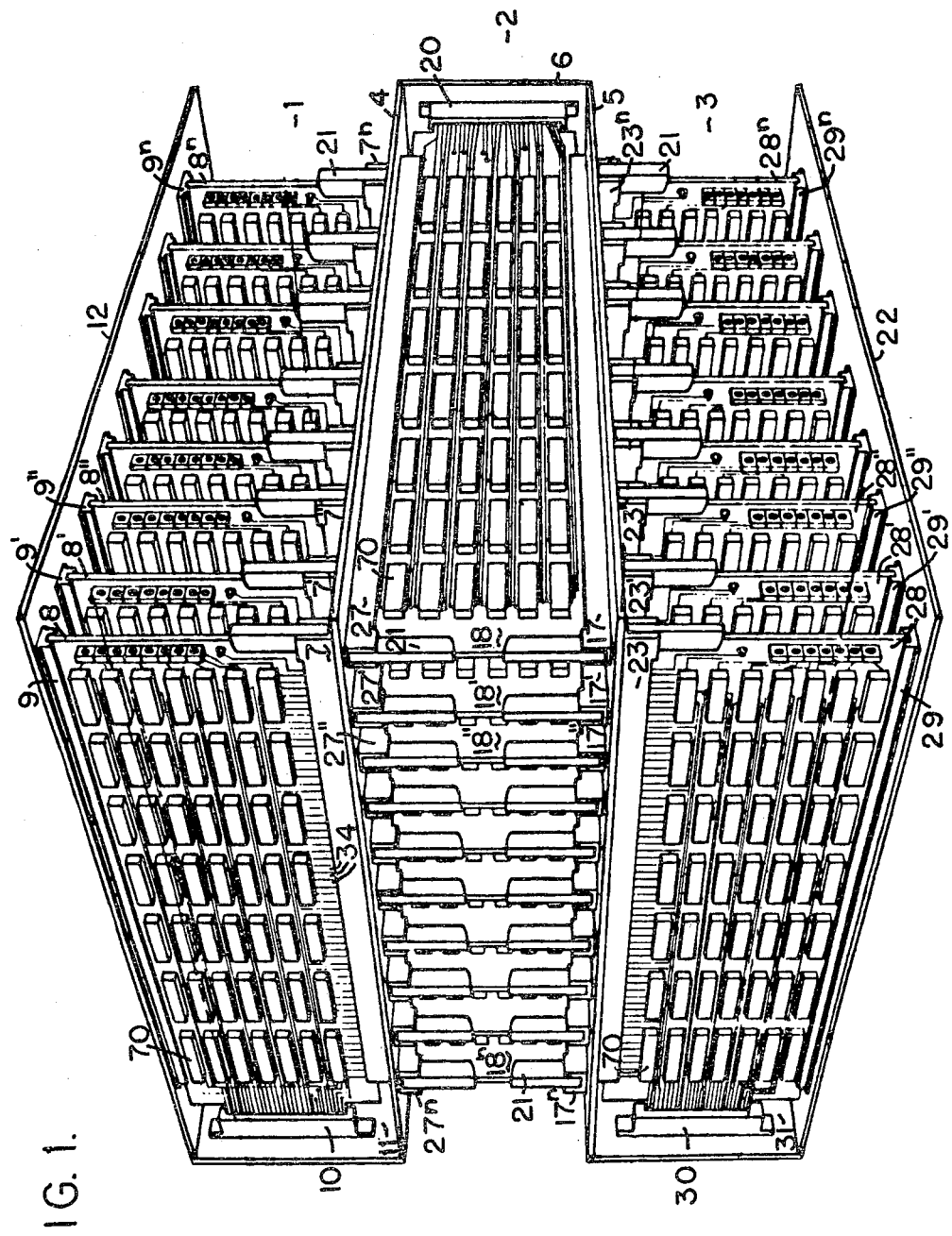
FIG. 1 is a perspective elevation view of a three-tier three-dimensional circuit structure.

An illustrative complete structure is shown in FIG. 1.

In FIG. 1, numeral 1 identifies the top or primary tier of plural circuit cards.

Similarly, numeral 2 identifies a middle or secondary tier of plural circuit cards. Note that these are orthogonally (at right angles) arranged with respect to the disposition of the primary cards.

Further, numeral 3 identifies the lower or tertiary tier of plural circuit cards. These are orthogonally arranged with respect to the disposition of the secondary cards. This results in a parallel arrangement with respect to the primary cards.

Mother-board 4 is disposed between the primary and secondary tiers, and mother-board 5 between the secondary and tertiary tiers. These two mother-boards are spaced apart in parallel relation by mechanical support 6, which may also be reproduced at the front and back sides of these mother-boards for mechanical rigidity. This has not been shown in FIG. 1 for sake of clarity.

Atop mother-board 4 are first plural, spaced, parallel-related zero-insertion-force (ZIF) elongated electrical connectors 7, 7', 7'', $7^n$; for example, eight of them. These each support and make electrical contact to an equal number of printed circuit cards 8, 8', 8'', $8^n$. The circuit cards are supported mechanically by elongated guides 9, 9', 9'', $9^n$.

In order that auxiliary electrical connections can be made to each circuit card, the same plurality of edge connectors 10 as circuit cards, i.e., $8^n$, are mounted upon rear vertical wall 11, in individual alignment with each ZIF connector $7^n$.

A top planar frame-piece 12 is rigidly attached to wall 11, and may be similarly attached to sides at the left and the right as well, for mechanical strength. These sides are not shown for sake of clarity; being of only ministerial significance.

In assembly, when the frame as a whole has been fabricated, the several circuit cards 8,-$8^n$ are pushed-inbetween corresponding ZIF connectors 7,-$7^n$ and guides 9,-$9^n$ until the contacts at the (left) end of the card enter edge connectors 10, etc. and are fully engaged.

The secondary tier 2 is inherently the same as tier 1, save that the whole tier is orthogonally related to tier 1. The several parallel-disposed ZIF connectors 17,-$17^n$, hold the several circuit cards 18,-$18^n$, which cards are also supported by ZIF connectors 27,-$27^n$.

The number of circuit cards in the second tier, say ten, is governed by the requirements of the over-all circuit of the structure. Plural edge connectors 20 are provided.

The third, or tertiary, tier 3 is inherently the same as an inverted tier 1.

On the underside of mother-board 5 are located plural, spaced, parallel-related ZIF elongated connectors 23, 23', 23'', $23^n$. These are aligned with the prior series of such connectors 7,-$7^n$ atop mother-board 4.

Connectors 23,-$23^n$ each engage and make electrical contact with an equal number of printed circuit cards 28, 28', 28'', $28^n$. These circuit cards are supported mechanically by elongated guides 29, 29', 29'', $29^n$ that are attached to a bottom planar frame-piece 22. The latter is the inverted equivalent of frame-piece 12.

Similarly, auxiliary connections to circuit-cards 28,-28$^n$ are made to the same plurality of edge connectors 30 as there are circuit cards. These connectors are mounted upon rear vertical wall 31, in individual alignment with each ZIF connector 23,-23$^n$.

Frame-piece 22 is rigidly attached to wall 31, which is also rigidly attached to mother-board 5. It may also be attached to sides at the left and the right as well, for mechanical strength. These sides are not shown, being of only ministerial significance.

Figure 3:
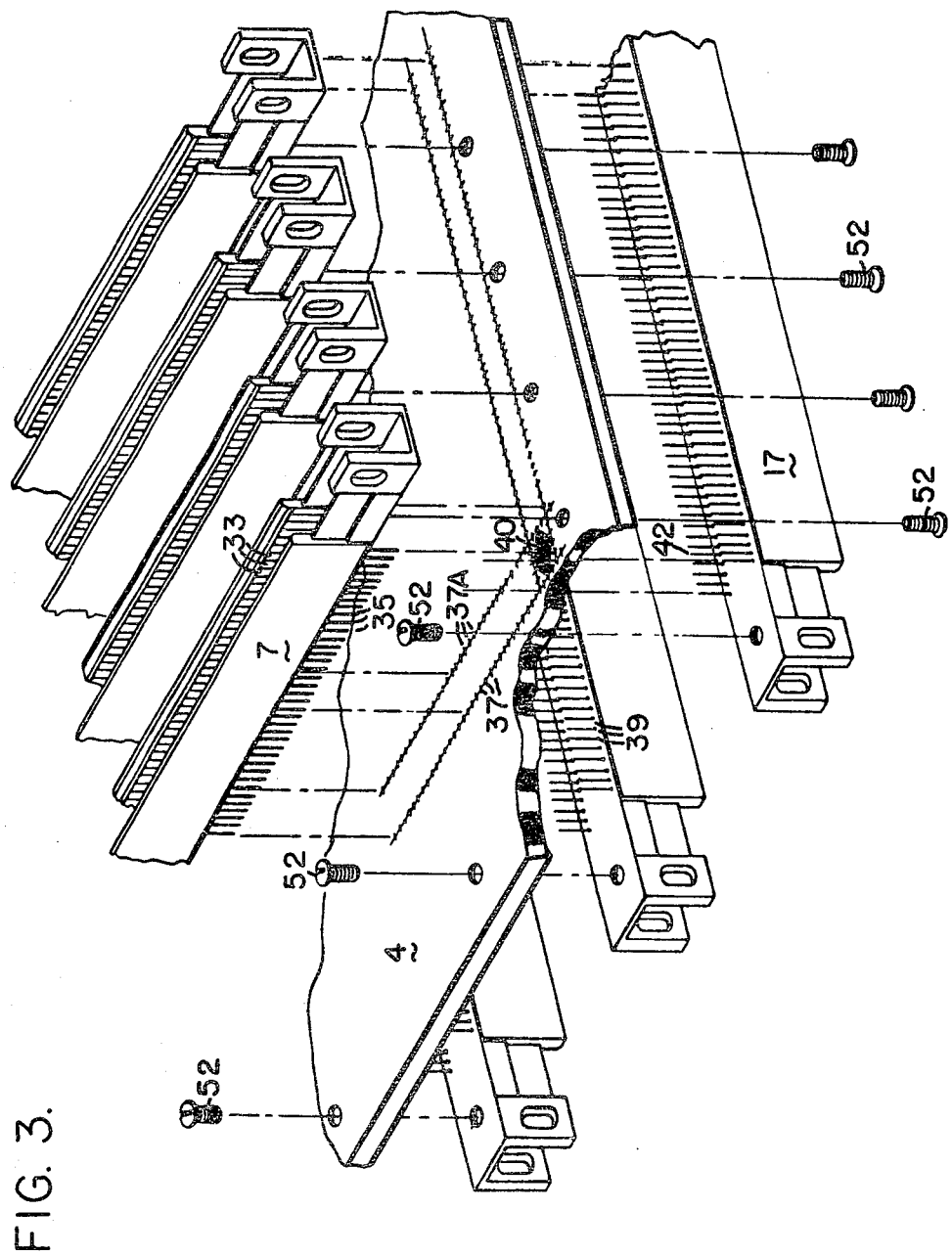
FIG. 3 is an enlarged exploded detail of the three-dimensional circuit structure, illustrating the orthogonal aspect.

Each ZIF connector, such as 7 in FIG. 3, carries a large number of adjacent, but electrically separate, contacts 33 along both inner vertical surfaces. These mate with contacts upon a circuit card, such as contacts 34 (FIG. 1) upon card 8. Each contact 33 has a pin 35 that is mechanically and electrically mutually attached, one to the other; the pin extending through the insulating material of the body of the connector.

These pins also pass through mother-board in a pattern that is shown at 4 in FIG. 4, at 37 and 37A, for example, for ZIF connector 7. Items 37 and 37A are plated-through holes; that is, the inner white area of each is a hole and the surrounding black area is electroplating within the hole and at a larger area on each side of mother-board 4. Each pin 35 is forced into a hole 37, as in an arbor press, so that there is firm mechanical and electrical contact between the electroplating within the hole and the pin.

Only certain pins are employed for connecting circuits on one circuit card, as 8, to another circuit on another card, as 18. These are the pins that are pressed into the holes in the diamond-shaped conductive areas 40. The two horizontally related holes are aligned with holes 37 and 37A, and so accept certain of pins 35. The two vertically related holes are aligned with holes 41 and 41A, and so accept certain pins 39. Accordingly, four pins are connected together electrically from one ZIF connector to the one adjacent to it on the opposite side of a mother-board, giving electrical contact redundancy.

Which pins are employed for connecting circuits from one circuit card to a related other card can be seen in the exploded view of FIG. 3. Two forward pins 35 of ZIF connector 7 pass through a conductive area 40. Similarly, two forward pins 42 of ZIF connector 17 pass through the same conductive area 40.

This establishes one connection between the tiers, such as connection 50 in FIG. 8. Numerous similar connections are also similarly established, for example, a total of 80 connections.

Note that connection 50 is relatively long in FIG. 8 because of the normal drafting layout. However, the same connection in FIG. 4 is only a few millimeters (mm) long, from one pin to an adjacent pin in area 40.

In FIG. 4 there are eight dotted "holes" surrounding conductive area 40A. These holes are absent around other areas, such as 40. This indicates that pins such as some of 35 and 39 are removed from the corresponding ZIF connectors to allow desired working room with respect to the desired pins that enter area 40A, and other areas, such as 40.

Numerous aligned pins and holes 37, 37A, 41, 41A, etc. are used as ground connections, establishing a desirable ground plane to prevent circulating currents. A suitable bus connects the thus formed conductive plane to ground; as to the frame at 6, 11, 22, etc.

It is found that the very many pins entering force-fit into the mother-board holes is sufficient to form a rigid and permanent over-all structure. However, a pair of screws, as 52, are typically provided at each end to fasten each ZIF connector to the mother-board, either by a tapped hole therein, or by nuts (not shown).

Figure 5:
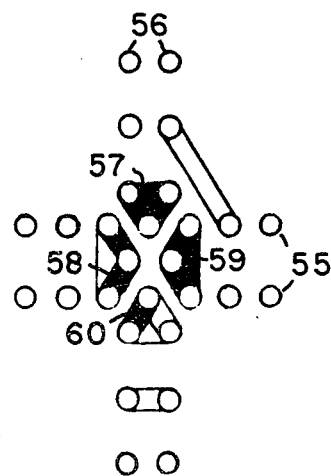

FIG. 5 shows an alternate arrangement of the conductive area 40 of FIG. 4. Two different types of ZIF connectors are predicated in FIG. 5, particularly as to having different spacing between companion rows. Horizontally, the rows of holes identified as 55 are more widely spaced than the orthogonally disposed rows of holes identified as 56.

Conductive areas 57, 58, 59 and 60 typically connect rows 55 and 56 in groups of three pins. This permits dual paths to be established, as for switching balanced audio signals or bidirectional streams of data.

Figure 6:
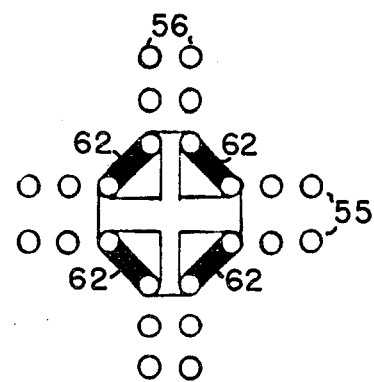
FIGS. 5, 6 and 7 are plan views of alternate modes of intersection connections.

FIG. 6 shows another alternate conductive area arrangement. Four diagonal conductive traces on the mother-board connect two pins each, one for each row 55 and 56. This permits four paths to be established. The cross outline depicts an area that is not conductive; but areas 62 are.

Figure 7:
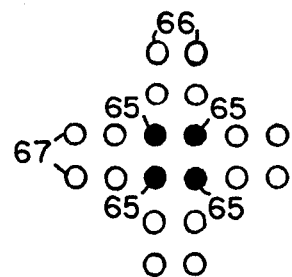

FIG. 7 shows still a further arrangement. In the four central conductive holes 65 one pin from each of rows 66 and 67 occupies one hole. Adjacent pins are not removed.

A typical electrical application of the circuit structure of this invention is for a routing switcher. This is a device in which a number of inputs, say 100, can be connected to any of 100 outputs by manipulating a push-button switchboard.

In FIG. 1 the great many rectangular elements 70 are solid-state cross-points; that is, plural transistor devices that accomplish signal transmission when "on" and blocking signal transmission when "off".

These elements preferably have small inherent capacitance, so that the variation of "on" and "off" conditions do not significantly affect the whole circuit of which they are a part. Integrated circuit elements, suitable for the gigahertz frequency range are suitable, such as the RCA type CA3127E, which has very low inter-junction capacitances. Typically three transistors are used for each cross-point, with an emitter-follower output. Thus constituted, the routing switcher is suited for either audio frequency or video frequency signals.

The schematic circuit of FIG. 8 details how the electrical paths for switching are arranged.

An input 71 to tier 1 enters a cross-point connection 70 at "x". It proceeds therethrough and passes out of tier 1 on conductor 50. Conductor 50 in actuality is conductive area 40 of FIG. 3, as has been previously explained. The connection becomes input 72 in tier 2.

The signal output from tier 2 enters input 73 of tier 3, passes to cross-point "x" thereof and out at output terminal 74.

Note that the signal that is processed passes through all of the three tiers. This is different than the prior art.

The "x" path recited above is the normal path for a signal from input 71. Should this path not be available an alternate path via conductor 76 is available. This carries on through another circuit card 77 of the secondary group to second input 81 of tertiary card group 3, thence to output 74.

In normal use there are a number of inputs simultaneously impressed upon group 1, with corresponding selected outputs. Being a three stage routing switcher this apparatus follows the Charles Clos type.

Card 78 in FIG. 8 represents card 2 of the primary group, with an input at 79. This becomes an output of the primary tier and enters the second input 80 of the secondary tier card 2.

Figure 2:
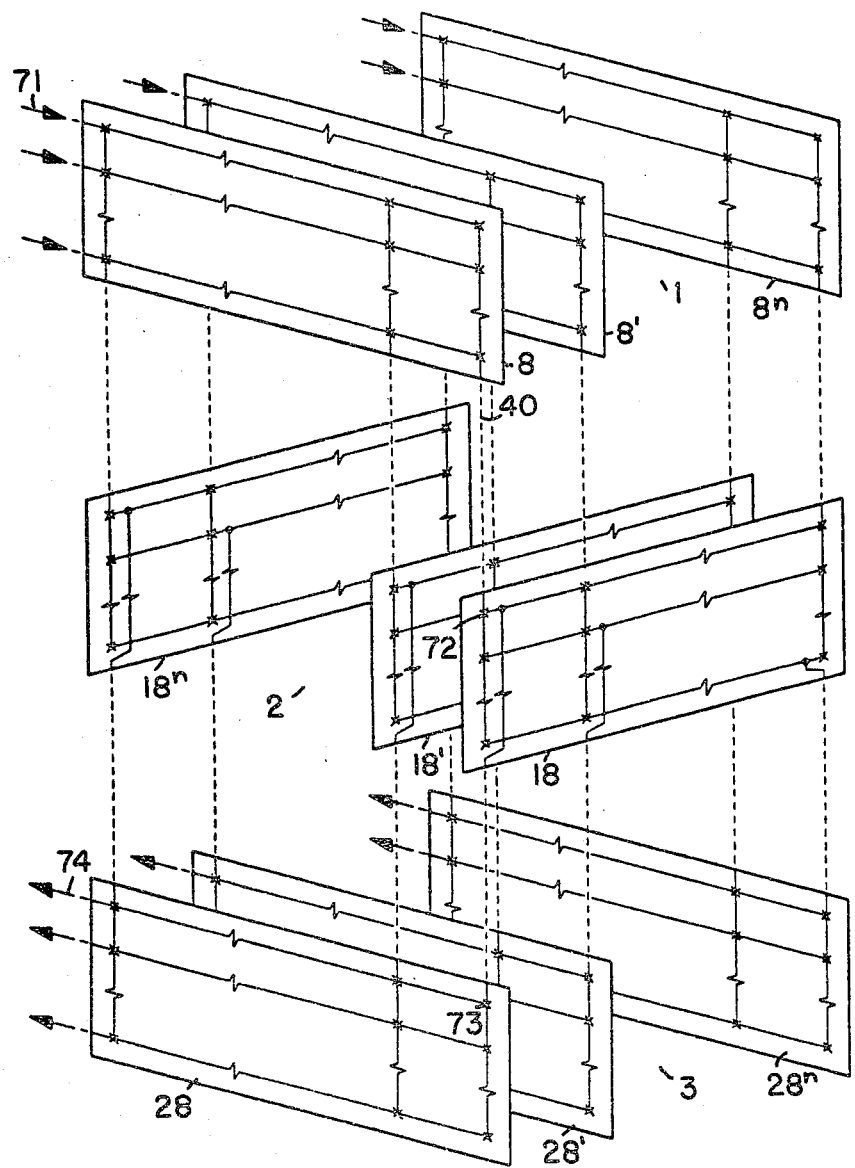
FIG. 2 is a simplified diagram of the structure of FIG. 1 showing how the connection scheme is implemented.

In the simplified diagram of FIG. 2, the top three cards 8, 8' and 8$^n$ are in primary tier 1 of FIG. 1.

Orthogonally related, cards 18, 18' and 18$^n$ are in the secondary tier 2 of FIG. 1.

Further, cards 28, 28' and 28$^n$ having the alignment of the top three cards, are in the tertiary tier 3 of FIG. 1.

Tracing input 1, this enters the first primary card 8 at 71. It progresses to output 40, which is one of the conductive areas 40 shown in FIG. 4. Thence to first secondary card 18, at point 72. From there it passes through another conductive area 40 to first tertiary card 28, at point 73. The signal exits card 28 at output 74.

Other inputs take different but equivalent paths through the routing switcher, as shown by the full and dotted lines and "x" points.

It will be recognized that the very short interconnections in this structure via the conductive areas 40 results in a routing switcher, for an example, of superior electrical characteristics. Capacitance is low and inductance is very low. Also, the lack of relatively long wires running in some proximity to other wires largely eliminates cross-talk.

FIG. 1 shows 8 circuit cards in primary tier 1, 10 cards in secondary tier 2, and 8 cards in tertiary tier 3. This is not the only number of cards for the tiers. The number of cards depends upon the ultimate size of the switcher in terms of the number of inputs and outputs thereof.

Another set of numbers embraces 10 cards in the primary tier, 19 cards in the secondary tier, and 10 cards in the tertiary tier.

The preferred manner of assembling the ZIF connectors is to first insert the individual contacts with the pins thereof in the holes of the mother-board. Then the housing; i.e., the sides and bottom, is assembled with an arbor press and a jig.

The transistor cross-points specified for the exemplary routing switcher are unidirectional in signal flow. All signal flow is from an input to an output.

Bidirectional signal flow can be obtained in an alternate construction in which tri-state buffer integrated circuits are substituted for the transistor cross-points; such as the 74LS365 hex. 3 state buffer. Also suitable are mechanical relays or silicon controlled rectifiers (SCRs).

Because of the three stage (tier) construction and the very short inter-connections via conductive areas 40, the size of the circuit structure of this invention is about one-fourth as large as conventional equipments of this type. This is an important practical advantage.

Each of the ZIF connectors is provided with an end latch 21 (FIG. 1) of insulating material, which hinges open to allow the circuit card to enter the connector and is manually closed over the end of the card to retain it.

In FIG. 1 the several solid-state cross-point integrated circuits 70 are shown as seven in number in each vertical row for the primary and tertiary tiers and six in number for the secondary tier.

In one typical embodiment there are ten primary matrices, nineteen secondary matrices, and ten tertiary matrices. One primary card, as 7 has nineteen outputs, each one of which becomes an input to a secondary card. Each output of a secondary card becomes an input to a tertiary card.

However, the number of "x" point integrated circuits 70 may vary according to the extent of the switching requirements; for instance, ten in each vertical row.

A three stage routing switcher has been described to illustrate the circuit structure of this invention. Five, seven, or even nine stage switchers can also be implemented by merely extending the technique that has been taught.

The connections and circuit structure of this invention are suited to carrying digital as well as analog signals.

I claim:

1. A three-dimensional circuit structure, comprising;
   (a) plural planar, spaced, stacked mother-boards,
   (b) first plural, spaced, parallel-related zero-insertion-force elongated connectors upon one surface of each mother-board,
   (c) second plural, spaced, parallel-related zero-insertion-force elongated connectors upon the opposite surface of each mother-board orthogonally related to those on said one surface,
   (d) electrically conductive pins selectively extending through each said mother-board between said first and second connectors that electrically connect said connectors, and
   (e) circuit-carrying cards inserted in each said elongated connector and disposed perpendicularly to the mother-board,
   whereby a circuit upon a said card inserted in a said first elongated connector is electrically connected to a circuit upon a said card inserted in a said second elongated connector.

2. The structure of claim 1, in which;
   (a) the structure is repeated to a total of three tiers of circuit cards.

3. The structure of claim 1, in which;
   (a) each said circuit-carrying card carries a plurality of matrix cross-point circuits forming a routing type switcher assembly.

4. The structure of claim 1, in which;
   (a) alternate tiers have the same number of circuit cards, and
   (b) intervening tiers have a larger number of circuit cards.

5. The structure of claim 4, in which;
   (a) each circuit card in an alternate tier has the same number of cross-points, and
   (b) each circuit card in an intervening tier has a fewer number of cross-points.

6. The structure of claim 3, in which;
   (a) each said cross-point circuit is a unidirectional solid-state device.

7. The structure of claim 3, in which;
   (a) each said cross-point circuit is a bidirectional device.

8. The structure of claim 1, in which;
   (a) conductive pins of at least one zero-insertion-force connector, and
   (b) conductive pins of a zero-insertion-force connector that crosses said one zero-insertion-force connector orthogonally, mutually electrically contact a conductive area (40) upon a said mother-board.

9. The structure of claim 8, in which;
   (a) holes allowing said pins to extend through said mother-board are plated through to be electrically conducting and are electrically connected, selectively, to a said conductive area (40).

10. The structure of claim 8, in which;
    (a) plural conductive pins extending through said mother-board that are out of electrical contact with said conductive area (40) are connected together electrically and to an electrical ground.

* * * * *